United States Patent [19]

Hsu

[11] Patent Number: 5,039,658

[45] Date of Patent: Aug. 13, 1991

[54] HIGH CURRENT CARRYING SUPERCONDUCTIVE FIBER

[75] Inventor: Che-Hsiung Hsu, Wilmington, Del.

[73] Assignee: E. I. Du Pont de Nemours and Company, Wilmington, Del.

[21] Appl. No.: 457,672

[22] Filed: Dec. 27, 1989

[51] Int. Cl.$^5$ .................. H01L 39/12; C04B 35/60
[52] U.S. Cl. .................. 505/1; 264/211.11; 264/332; 505/740
[58] Field of Search ........... 264/63, 211.11, 211.14, 264/211.17, 211, 211.12, 332; 505/740, 704, 809, 739

[56] References Cited

FOREIGN PATENT DOCUMENTS 337095  10/1989  Japan .................. 505/782

OTHER PUBLICATIONS

Miaoulis et al., "Zone-Melting. . . , Superconducting Films", *J. Phys. D. App. Phys*, (1989).
*Applied Physics Letters*, Levinson et al., "Laser Zone--Melted Bi-Sr-Ca-Cu-O Thick Films", Oct. 16, 1989.
Japanese Journal of Applied Physics, vol. 28, No. 8, Aug. 1989, pp. L1402-L1404, Tomoko Goto.
Journal of Applied Physics, vol. 65, No. 6, Mar. 15, 1989, pp. 2392-2397, Sarkar et al.
Japanese Journal of Applied Physics, vol. 27, No. 10, Oct. 1988, pp. L1845-L1847, Goto and Takeuchi.
Superconductivity Science Technology, vol. 1, No. 1, Aug. 29, 1988, pp. 71-74, P. W. May et al.
Materials Letters, vol. 6, Nos. 11, 12, Jul. 1988, pp. 390-392, G. R. Wagner et al.

*Primary Examiner*—Jan H. Silbaugh
*Assistant Examiner*—Christopher A. Fiorilla

[57] ABSTRACT

$Bi_2Sr_2Ca,Cu_2$ 2212 superconductive oxide fiber having enhanced current carrying capacity is prepared by forming an intimate mixture of the $Bi_2Sr_2Ca_1Cu_2$ superconductive oxide precursors or their functional equivalents, firing the mixture at a temperature of at least 400° C. but below the melting point of the superconductive oxide, dispersing the fired mixture in an organic binder, extruding the dispersion as fiber extrudate, firing the fiber at a temperature sufficient to cause the organic binder to burn off and to cause melting of the superconductive oxide while substantially retaining the filamentary shape, and then cooling the fiber.

1 Claim, 1 Drawing Sheet

HIGH CURRENT CARRYING SUPERCONDUCTIVE FIBER

BACKGROUND OF THE INVENTION

Superconductive $Bi_2Sr_2Ca_1Cu_2$ oxides are known in the art. They are prepared by combining the appropriate precursors in the required proportions, firing the mixture and allowing the mixed oxide to cool.

The product may then be reground and sintered to produce a porous product of superconductive $Bi_2Sr_2Ca_1Cu_2$ oxide having low current carrying capacity. It is an object of this invention to produce a fiber of superconductive $Bi_2Sr_2Ca_1Cu_2$ oxide which is less porous and has improved current carrying capacity. This invention also relates to a novel method for producing high current carrying $Bi_2Sr_2Ca_1Cu_2$ superconductive oxide articles.

SUMMARY OF THE INVENTION

This invention provides a method of preparing high current carrying $Bi_2Sr_2Ca_1Cu_2$ 2212 superconductive oxide fiber comprising the steps of:

1. Forming an intimate mixture of the superconductive oxide precursors or their functional equivalents with Bi/Sr/Ca/Cu in the molar ratio of 2/2/1/2;
2. Firing the mixture at a temperature of at least 400° C. but below the melting point of the superconductive oxide to cause interaction between the components;
3. Dispersing particles of the fired mixture in an organic binder and extruding the dispersion in fiber form;
4. Firing the extrudate at a temperature sufficient to cause the organic binder to burn off and to cause melting of the superconductive oxide while substantially retaining the filamentary shape; and
5. Cooling the fiber.

Articles and particularly fibers prepared from melted $Bi_2Sr_2Ca_1Cu_2$ superconductive oxide are also contemplated.

This invention also provides a method of preparing high current carrying $Bi_2Sr_2Ca_1Cu_2$ superconductive oxide articles comprising the steps of:

1. Forming an intimate mixture of the superconductive oxide precursors or their functional equivalents with Bi/Sr/Ca/Cu in the molar ratio of 2/2/1/2;
2. Firing the mixture at a temperature of at least 400° C. but below the melting point of the superconductive oxide to cause interaction between the components;
3. Pressing particles of the fired mixture optionally with organic binder to an article form;
4. Firing the article at a temperature sufficient to burn off the organic binder if present and to melt the superconductive oxide; and
5. Cooling the article.

DETAILED DESCRIPTION OF THE INVENTION

Figure 1:
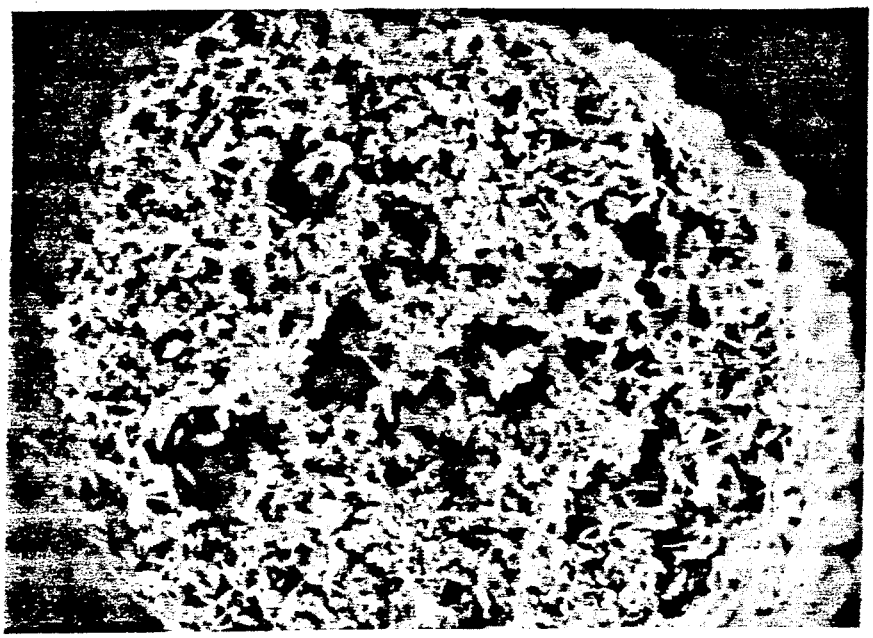
FIG. 1 is a stereoscan photomicrograph of a cross-section of the $Bi_2Sr_2Ca_1Cu_2$ superconductive oxide which was extruded in fiber form, and heated below the melting point of the oxide. The fiber has substantially retained its filamentary shape.

Superconductive Bi/Sr/Ca/Cu oxide of the so-called 2212 type, that is, in which the elements are in the indicated proportions are known in the art. The present invention provides a method of preparing fibers and articles of said superconductive oxide that exhibit enhanced electrical conductivity and current carrying capacity, and that reduces the effect of magnetic field on magnetic flux exclusion.

In accordance with the present process, the various oxides or functional equivalents thereof are mixed thoroughly. An intimate mixture of the oxides or their functional equivalents, such as the acetates, nitrates, hydroxides, which provide the specified metals during the course of the process, combined in a Bi/Sr/Ca/Cu atomic ratio corresponding substantially to 2/2/1/2, is fired at temperatures of at least 400° C. but below the melting point of the superconductive oxide. Preferably the mixture is heated to a temperature between 500° C. and 600° C. The firing of the intimate admixture causes the components to react with each other and form a substantially homogenous product which could be dispersed in aqueous and non-aqueous binder/carrier solution for use in the extrusion step.

Particles of the fired mixture are then dispersed in an organic binder to assist extrusion in the form of a coherent fiber. As the organic binder, one may employ any of a variety of organic polymers. Polystryrene or polyvinylalcohol in a suitable solvent have been found useful. A sufficient amount of polymer is employed to permit ready extrusion.

The polymer-particulate mixture is then extruded into fibers by procedures well known in the art and the extrudate collected and fired to a temperature above about 875° C., sufficient to melt the fiber. This occurs in a matter of minutes at temperatures slightly above the melting point of the superconductive $Bi_2Sr_2Ca_1Cu_2$ oxide. The temperature and heating time should be kept to a minimum to avoid undue loss of material which would affect stoichiometry and to retain the filamentary shape of the fiber.

If a superconductive oxide article other than a fiber is desired, it is not necessary to disperse the particles in an organic binder. The particles may be pressed to an article and then fired to a temperature of above about 875° C. sufficient to burn off any organic binder if present and to melt the article. The melted superconductive oxide is then cooled and may be machine cut to a desired shape.

TEST PROCEDURES

Critical Current Density ($J_c$) is defined as the threshold current which, when passed through a given cross-sectional area of a superconductor, transforms the material from the superconductive state to the normal state. The measurement is done using a 4-probe method known in the art. A silver paste is used as electrode material to reduce contact resistance to about 5 ohm. The two inner electrodes are about 6 mm apart. While the fiber is immersed in liquid nitrogen, current is applied to the two outer electrodes. The voltage corresponding to the current applied through the two outer electrodes is measured between the two inner electrodes with an electrometer. As current is increased, at a certain point, the sample is driven to the normal state. The current flows at a voltage of 1 microvolt is defined as the threshold current. The threshold current normalized with the cross-section of the fiber sample is defined as $J_c$.

The Meissner transition is determined as follows: A measurement is made using an alternating current technique in which the change in inductance of a coil caused by flux exclusion from a sample inside the coil is measured. A signal is obtained which, after substraction of a background empty coil voltage, is related to the amount of superconducting material in the sample volume. By making the measurement over a range of temperatures, the critical temperature of the sample and the temperature dependence of the flux exclusion can be obtained. The influence of magnetic field on flux exclusion was determined by maintaining a sample at 77° K. and vary the DC magnetic field between 0 and 300 oersteds.

Examples 1 and 2 below are intended to be illustrative of the invention and not limiting. Both show preparation of $Bi_2Sr_2Ca_1Cu_2$ oxide fibers which can carry current at 77° K. without resistance.

EXAMPLE 1

A polystyrene solution was first made by dissolving 30 g of polystyrene (Aldrich #18243-5; MW:430,165) in 90 g toluence at room temperature. To 8.0 g of this solution was added 11.3 g of a particulate $Bi_2Sr_2Ca_1Cu_2$ (2212) oxide precursor made in the following manner.

A cupric acetate solution was prepared by dissolving 21.9 g cupric acetate (Baker #5) in 300 ml water with heat. A powder mixture, made by mixing 25.2 g $Bi_2O_3$ (Alfa, milled), 27.0 g strontium hydroxide octahydrate (Ventra), and 4.09 g calcium hydroxide (EM Science) for one hour in a plastic bottle, containing 150 g zirconia balls, which was shaken on a paint shaker, was added to the solution. The cupric acetate solution with the powder mixture became a dark, brown-black slurry after being concentrated with heat. The hot slurry was then freeze-dried to a dark brown, soft, fluffy, talc-like powder. The powder was air-fired in a furnace according to the following cycle: heat-up from 20° C. to 500° C. for one hour, cool to room temperature. The collected powder was not superconductive and was dispersed in the polystyrene solution. The X-ray reflection data showed that the precursor powder is a mixture of $Bi_2O_3$ and other unidentified crystalline species.

The precursor dispersed in polystyrene was loaded into a 30 ml syringe and extruded on a polytetrafluoroethylene sheet. Pieces of the extrudate were then placed in an alumina crucible for firing in air according to the following cycle: room temperature to 160° C. at 1° C./min, 1 hour at 160° C., 2° C./min to 800° C., 1 min at 800° C., 2° C./min to 835° C., 8 hours at 835° C., 5° C./min to C./min to 600° C., 1 min at 600° C., 5° C./min to 300° C., 1 min at 300° C., 5° C./min to room temperature. The fired extrudate was very porous and had a rough surface, but showed a Meissner transition at 80° K. when cooled from room temperature to 10° K., indicating that they contained superconductive $Bi_2Sr_2Ca_1Cu_2$ oxide. Although the fired extrudate excluded magnetic flux, it did not show zero resistance at 77° K. at an applied current density of 0.01 amps/cm². The resistance was reduced by 63% from room temperature to 77° K.

The fired extrudate was melted for a short time, in the order of minutes, at a temperature slightly above the melting point (about 875° C.). This was carried out in the following manner: A 2 cm piece of the fired extrudate was placed on each of three substrates—yttrium-stabilized zirconia, calcium-stabilized zirconia, and magnesium oxide—which were then placed in a Fisher #497 furnace for air firing. The following firing cycle was used: room temperature to 500° C. at 10° C./min, 5 min at 500° C., 10° C./min to 835° C., 10 min at 835° C., 2° C./min to 885° C., 10 min at 885° C., cooled to room temperature quickly with furnace door open. The extrudate on each substrate had a very shiny, fused surface and was less porous, indicating that it melted at 885° C. Although it melted, it still stayed very much in the same shape measuring 2 cm by 2 mm by about 0.4 mm. The consolidated extrudates from this heat treatment adhered to their respective substrates but were found to be superconductive at 77° K. with a $J_c$ of about 10 amps/cm². The results clearly show the importance of melting to attain the $Bi_2Sr_2Ca^1Cu_2$ oxide fiber which can carry current without resistance at 77° K.

EXAMPLE 2

A particulate precursor was first made by mixing bismuth nitrate pentahydrate (Baker #1092-01), strontium nitrate (EM, SX 1020-2), calcium acetate monohydrate (Baker #1226-01), and cupric acetate monohydrate (Baker #1776-1) in the Bi:Sr:Ca:Cu ratio of 2:2:1:2. Each of the ingredients was ground in a mortar prior to weighing and then ground together in a mortar until a smooth paste was formed. The blended mixture was place in alumina crucibles and heated in a furnace from room temperature to 300° C. and held at 300° C. for 30 minutes; the temperature was raised to 400° C. and held at 400° C. for 60 minutes. The mixture was reground after cooling and reheated in the furnace at 500° C. for 2 hours. The powder was not superconductive and exhibited several major X-ray (Cu $k_\alpha$ source) reflection peaks at $2\theta$ of 12.4, 25.2, 28.1, 29.3, 30.7, 31.8, 38.4, 38.8, 44.2 and 46.8, which could not be attributed to $Bi_2O_3$, SrO, $Ca_2O$, or CuO. 20 g of the particulate precursor was then mixed with 20 g water containing 0.1 g of a deflocculating/wetting agent (Dowfax 382). The mixture was then blended in an oscillating ball mill for one hour. The precursor/water slurry was mixed with an aqueous solution of a high molecular weight of partially hydrolyzed polyvinyl alcohol ("ELVANOL"5042) which was prepared by mixing 2.3 g of the polyvinyl alcohol, 20 g water, 0.23 g glycerol and 0.5 g glutaric acid. The mixture was stirred and concentrated under vacuum. The thick dispersion was loaded into a 5 ml plastic syringe fitted with a 22 gauge stainless steel syringe needle. The syringe was placed against a pump for extrusion on a polytetrafluoroethylene sheet.

Portions of the extrudate were hung on silver tubing supported horizontally by a metal rack. The silver tubing was 9 cm above the bottom of the rack. The whole assembly was then placed in the Fisher #497 furnace for firing in air according to the following cycle: room temperature to 160° C. at 2° C./min, 10 min at 160° C., 2° C./min to 830° C., 6 hours at 830° C., 2° C./min to 850° C., 5 min at 850° C., 20° C./min to 600° C., 1 minute at 600° C., 20° C./min to 300° C., 1 minute at 300° C., 10° C./min to 100° C. The $T_{max}$, 850° C., is lower than the melting point of the $Bi_2Sr_2Ca_1Cu_2$ oxide. FIG. 1 shows a cross-section of the fiber extrudate after said fiber was heated according to the above-described cycle with a $T_{max}$, 850° C. The fiber has substantially retained its filamentary shape but is very porous and does not have a shiny fused surface, indicating melting has not occurred. The porous weak fiber has a diameter of about 240 micrometers. These fiber extrudates showed a Meissner transition when cooled from room temperature to 20° K. The on-set transition temperature was 85° K., but the flux was still not completely excluded at 20° K. In addition, the flux exclusion was reduced by 95% in an applied magnetic field of 100 oersted. Although the fired extrudate excluded magnetic flux, the fiber extrudate did not have a zero resistance at an applied current density of 0.02 amps/cm² at 77° K. nor was the electrical resistance reduced significantly from room temperature to 77° K. The electrical conductivity of the fired fiber extrudated at room temperature was 14 ohm$^{-1}$cm$^{-1}$.

Figure 2:
FIG. 2 is a stereoscan photomicrograph of a cross-section of the fiber of FIG. 1 wherein said fiber was melted. The fiber has substantially retained its filamentary shape.

Other portions of the extrudate were hung over alumina tubing which was supported horizontally by a metal rack. The alumina tubing was 9 cm above the bottom of the rack. The whole assembly was then placed in a Fisher 190 497 furnace. The following cycle was used for firing in air: room temperature to 160° C. at 2° C./min, 30 min at 160° C., 2° C./min to 830° C., 60 min at 830° C., 5° C./min to 880° C., 5 min at 880° C., 20 C./min to 600° C., 1 min at 600° C., 20° C./min to 300° C., 1 min at 300° C., 10° C./min to 35° C. The maximum heating temperature, $T_{max}$, 880° C., is above the melting temperature of the $Bi_2Sr_2Ca_1Cu_2$ oxide in air. FIG. 2 shows a cross-section of the fiber extrudate after said fiber was heated according to the above described cycle with a $T_{max}$, 880° C. The fiber is only slightly porous and has a very shiny, fused surface indicating melting has occurred. The fiber extrudate has a diameter measurement of above 170 micrometers. These fiber extrudates showed a sharp Meissner transition when cooled from room temperature to 10° K. Magnetic flux exclusion began at 90° K. and was most complete at 75° K. The flux exclusion was reduced by 17% in an applied magnetic field of 100 oersted. Critical current density, $J_c$, of the fired extrudates at 77° K. was 331 amps/cm². Electrical conductivity at room temperature was 210 ohm$^{-1}$cm$^{-1}$.

The fiber extrudates shown in FIGS. 1 and 2 have a diameter ratio of 1.41. Comparison between volumes $(1.41)^2$ shows the fiber extrudate of FIG. 1 has a volume 1.99 times the size of the volume of the fiber extrudate in FIG. 2 indicating the fiber extrudate in FIG. 1 is more porous. The fiber extrudate in FIG. 1 also has a rougher surface than the fiber extrudate in FIG. 2. All of these physical properties indicate that the fiber extrudate of FIG. 2 has melted while the fiber extrudate of FIG. 1 has not melted.

Significantly, the melted fiber extrudate has superior superconductive properties compared to the non-melted fiber extrudate. The non-melted fiber extrudate at 77° K. was not superconductive at 0.02 amps/cm² while the $J_c$ of the melted fiber extrudate was 331 amps/cm². These measure-ments indicate that the non-melted fiber extrudate showed resistance and was not superconductive at an applied current density of 0.02 amps/cm² at 77° L. while the melted fiber extrudates neither showed resistance nor became non-superconductive until an applied current density of 331 amps/cm² at 77° K. Although both fiber extrudates excluded magnetic flux, the non-melted fiber extrudate did not completely exclude magnetic flux at 20° K. while the melted fiber extrudate almost completely excluded magnetic flux at a higher temperature of 75° K. Also, with an applied magnetic field of 100 oersted, the flux exclusion for the non-melted fiber extrudate was reduced by 95% compared to only a 17% reduction for the melted fiber extrudate. Furthermore, the non-melted fiber extrudate had a lower, room-temperature conductivity than the melted fiber extrudate (14 vs 210 ohm$^{-1}$cm$^{-1}$).

I claim:

1. A method for preparing high current carrying $Bi_2Sr_2Ca_1Cu_2$ superconductive oxide fiber comprising the steps of:
   a) forming an intimate mixture of superconductive oxide precursors with Bi/Sr/Ca/Cu in the molar ratio of 2/2/1/2;
   b) firing the mixture at a temperature of at least 400° C. but below the melting point of the superconductive oxide to cause interaction between components of the mixture to form a substantially homogenous product;
   c) dispersing particles of the fired mixture in an organic binder and extruding the dispersion in fiber form;
   d) firing the extrudate at a temperature sufficient to cause the organic binder to burn off and to cause melting of the resulting superconductive oxide while substantially retaining the fiber's filamentary shape; and
   e) cooling the fiber to resolidify the fiber while substantially retaining its filamentary shape.

* * * * *